(12) United States Patent
Li et al.

(10) Patent No.: US 12,527,138 B2
(45) Date of Patent: Jan. 13, 2026

(54) DISPLAY PANELS AND DISPLAY DEVICES

(71) Applicant: Guangzhou China Star Optoelectronics Semiconductor Display Technology Co., LTD., Guangdong (CN)

(72) Inventors: Jubin Li, Guangdong (CN); Junqing Shen, Guangdong (CN)

(73) Assignee: Guangzhou China Star Optoelectronics Semiconductor Display Technology Co., Ltd., Guangzhou (CN)

( * ) Notice: Subject to any disclaimer, the term of this patent is extended or adjusted under 35 U.S.C. 154(b) by 365 days.

(21) Appl. No.: 18/275,062

(22) PCT Filed: May 16, 2023

(86) PCT No.: PCT/CN2023/094393
§ 371 (c)(1),
(2) Date: Jul. 31, 2023

(87) PCT Pub. No.: WO2024/221499
PCT Pub. Date: Oct. 31, 2024

(65) Prior Publication Data
US 2025/0089421 A1    Mar. 13, 2025

(30) Foreign Application Priority Data

Apr. 23, 2023 (CN) .......................... 202310443809.0

(51) Int. Cl.
*H10H 20/857* (2025.01)
*H01L 25/16* (2023.01)

(52) U.S. Cl.
CPC ......... *H10H 20/857* (2025.01); *H01L 25/167* (2013.01)

(58) Field of Classification Search
CPC .. H01L 25/167; H10H 29/8321; H10H 29/39; H10H 29/142; H10H 20/857
See application file for complete search history.

(56) References Cited

U.S. PATENT DOCUMENTS

| | | | |
|---|---|---|---|
| 2023/0005962 A1* | 1/2023 | Lee | H01L 25/0753 |
| 2023/0238373 A1* | 7/2023 | Choi | H01L 25/167 |
| | | | 257/91 |
| 2023/0238398 A1* | 7/2023 | Choi | H10D 86/60 |
| 2023/0238493 A1* | 7/2023 | Lee | G09F 9/3026 |
| | | | 257/79 |
| 2023/0238494 A1* | 7/2023 | Choi | H10H 20/857 |
| | | | 257/79 |
| 2023/0246011 A1* | 8/2023 | Choi | H01L 24/08 |
| | | | 257/91 |
| 2023/0246148 A1* | 8/2023 | Lee | G09F 9/33 |
| | | | 257/79 |

(Continued)

Primary Examiner — Victor A Mandala (57) ABSTRACT

Display panels and display devices are provided. In the display panel, a first line width is less than a difference between a second linear distance and an alignment deviation, and a first linear distance is less than a difference between a second line width and the alignment deviation, so that when lateral wirings deviate, there is at least one lateral wiring for connecting the first wiring and the second wiring corresponding arranged, thus the display panel can works normally, thereby improving a yield rate of the display panel.

20 Claims, 3 Drawing Sheets

(56) References Cited

U.S. PATENT DOCUMENTS

| | | | |
|---|---|---|---|
| 2023/0268474 A1* | 8/2023 | Jeong | H10D 86/60 257/79 |
| 2023/0282602 A1* | 9/2023 | Hong | H10H 20/8583 257/72 |
| 2024/0204149 A1* | 6/2024 | Lee | H10H 20/85 |
| 2024/0258476 A1* | 8/2024 | Wang | G09F 9/33 |
| 2024/0313189 A1* | 9/2024 | Kim | H01L 25/167 |
| 2024/0339462 A1* | 10/2024 | Sun | H10D 86/00 |
| 2024/0355982 A1* | 10/2024 | Li | H10H 20/857 |
| 2024/0395988 A1* | 11/2024 | Wang | H10H 20/01 |
| 2025/0081695 A1* | 3/2025 | Wang | G06F 1/1601 |

\* cited by examiner

DISPLAY PANELS AND DISPLAY DEVICES

RELATED APPLICATIONS

This application is a National Phase of PCT Patent Application No. PCT/CN2023/094393 having International filing date of May 16, 2023, which claims the benefit of priority of Chinese Patent Application No. 202310443809.0 filed on Apr. 23, 2023. The contents of the above applications are all incorporated by reference as if fully set forth herein in their entirety.

TECHNICAL FIELD AND BACKGROUND OF THE INVENTION

The present disclosure relates to the field of display technologies, and in particular, to display panels and display devices.

Submillimeter light-emitting diode (mini-LED) display devices and miniature light-emitting diode (micro-LED) display devices are widely used because of advantages of self-illumination, high brightness, high contrast, high resolution and color saturation, long life, fast response, and low power consumption. In order to achieve seamless splicing, the existing glass-based mini-LED and micro-LED display panels generally use the back-bonding technology to reduce a splicing width. Specifically, connection terminals are provided on both sides of the glass substrate, and then the connection terminals on both sides of the glass substrate are connected through front wires, lateral wires, and back wires. However, in a laser etching process of the lateral wires of the existing display devices, due to insufficient alignment accuracy, positions of the lateral wires may be shifted, thus one lateral wire may connect two adjacent front wires and two adjacent back wires, resulting in short circuit between the adjacent front wires and between the adjacent back wires, which affects a yield rate of the display devices.

Therefore, the existing display devices have the technical problem that an alignment accuracy of the lateral wires is insufficient, resulting in a short circuit between adjacent wires.

SUMMARY OF THE INVENTION

Embodiments of the present disclosure provide display panels and display devices, which solve the technical problem of insufficient alignment accuracy of lateral wires in existing display devices, resulting in a short circuit between adjacent wires.

In order to solve the above problem, technical solutions provided by the present disclosure are as following.

Embodiments of the present disclosure provide a display panel, including:
- a substrate including a first surface, a second surface oppositely arranged, and a lateral surface connecting the first surface and the second surface;
- first wirings arranged on the first surface of the substrate;
- second wirings arranged on the second surface of the substrate and corresponding to the first wirings;
- lateral wirings, herein, a part of each of the lateral wirings is arranged on the lateral surface, and some of the lateral wirings connect the first wirings and the second wirings; and
- herein, a maximum line width of the lateral wirings is defined as a first line width, a maximum linear distance between two adjacent ones of the lateral wirings is defined as a first linear distance, a minimum line width of the first wirings is defined as a second line width, a minimum linear distance of the first wirings is defined as a second linear distance, and there is an alignment deviation between the first wirings and the second wirings; the first line width is less than a difference between the second linear distance and the alignment deviation, and the first linear distance is less than a difference between the second line width and the alignment deviation.

In some embodiments, line widths of any two ones of the lateral wirings are equal, and a linear distance between any two adjacent ones of the lateral wirings is same.

In some embodiments, the alignment deviation between the first wirings and the second wirings is 0, a projection of the first wirings on the substrate coincides with a projection of the second wirings on the substrate.

In some embodiments, some of the lateral wirings are insulated from the first wirings, and the lateral wirings insulated from the first wirings are insulated from the second wirings.

In some embodiments, the lateral wirings include first lateral wirings, a contact area between the first lateral wirings and the first wirings is equal to cross-sectional areas of the first lateral wirings, and a contact area between the first lateral wirings and the second wirings is less than or equal to the cross-sectional areas of the first lateral wirings.

In some embodiments, the lateral wirings include second lateral wirings, a contact area between the second lateral wirings and the first wirings is less than cross-sectional areas of the second lateral wirings, and a contact area between the second lateral wirings and the second wirings is less than the cross-sectional areas of the second lateral wirings.

In some embodiments, the first wirings include first sub wirings and second sub wirings;
the second wirings include third sub wirings arranged corresponding to the first sub wirings and fourth sub wirings arranged corresponding to the second sub wirings; and
a line width of each of the first sub wirings is equal to a line width of each of the third sub wirings, a line width of each of the second sub wirings is equal to a line width of each of the fourth sub wirings, the line width of each of the second sub wirings is greater than the line width of each of the first sub wirings, a number of the lateral wirings for connecting the first sub wirings and the third sub wirings is less than or equal to a number of the lateral wirings for connecting the second sub wirings and the fourth sub wirings.

In some embodiments, the line width of each of the first sub wirings is less than a sum of a line width of a corresponding one of the lateral wirings and a linear distance of the lateral wirings corresponding arranged, and each of the first sub wirings is connected to one of the third sub wirings through one of the lateral wirings.

In some embodiments, the line width of each of the second sub wirings is greater than a sum of twice line width of a corresponding one of the lateral wirings and a linear distance of the lateral wirings corresponding arranged, and each of the second sub wirings is connected to one of the fourth sub wiring through more than two of the lateral wirings.

In some embodiments, a total cross-sectional area of the lateral wirings between any group of one first wiring of the first wirings and a corresponding one second wiring of the second wirings is one-half to two-thirds of a cross-section area of the one first wiring or the one second wiring connected to the lateral wirings.

At the same time, display devices are provided according to embodiments of the present disclosure. The display device includes a display panel and driver chips, and the display panel includes:

a substrate including a first surface, a second surface oppositely arranged, and a lateral surface connecting the first surface and the second surface;

first wirings arranged on the first surface of the substrate;

second wirings arranged on the second surface of the substrate and corresponding to the first wirings;

lateral wirings, herein, a part of each of the lateral wirings is arranged on the lateral surface, and some of the lateral wirings connect the first wirings and the second wirings; and herein, a maximum line width of the lateral wirings is defined as a first line width, a maximum linear distance between two adjacent ones of the lateral wirings is defined as a first linear distance, a minimum line width of the first wirings is defined as a second line width, a minimum linear distance of the first wirings is defined as a second linear distance, and there is an alignment deviation between the first wirings and the second wirings; the first line width is less than a difference between the second linear distance and the alignment deviation, and the first linear distance is less than a difference between the second line width and the alignment deviation.

In some embodiments, line widths of any two ones of the lateral wirings are equal, and a linear distance between any two adjacent ones of the lateral wirings is same.

In some embodiments, the alignment deviation between the first wirings and the second wirings is 0, a projection of the first wirings on the substrate coincides with a projection of the second wirings on the substrate.

In some embodiments, some of the lateral wirings are insulated from the first wirings, and the lateral wirings insulated from the first wirings are insulated from the second wirings.

In some embodiments, the lateral wirings include first lateral wirings, a contact area between the first lateral wirings and the first wirings is equal to cross-sectional areas of the first lateral wirings, and a contact area between the first lateral wirings and the second wirings is less than or equal to the cross-sectional areas of the first lateral wirings.

In some embodiments, the lateral wirings include second lateral wirings, a contact area between the second lateral wirings and the first wirings is less than cross-sectional areas of the second lateral wirings, and a contact area between the second lateral wirings and the second wirings is less than the cross-sectional areas of the second lateral wirings.

In some embodiments, the first wirings include first sub wirings and second sub wirings;

the second wirings include third sub wirings arranged corresponding to the first sub wirings and fourth sub wirings arranged corresponding to the second sub wirings; and a line width of each of the first sub wirings is equal to a line width of each of the third sub wirings, a line width of each of the second sub wirings is equal to a line width of each of the fourth sub wirings, the line width of each of the second sub wirings is greater than the line width of each of the first sub wirings, a number of the lateral wirings for connecting the first sub wirings and the third sub wirings is less than or equal to a number of the lateral wirings for connecting the second sub wirings and the fourth sub wirings.

In some embodiments, the line width of each of the first sub wirings is less than a sum of a line width of a corresponding one of the lateral wirings and a linear distance of the lateral wirings corresponding arranged, and each of the first sub wirings is connected to one of the third sub wirings through one of the lateral wirings.

In some embodiments, the line width of each of the second sub wirings is greater than a sum of twice line width of a corresponding one of the lateral wirings and a linear distance of the lateral wirings corresponding arranged, and each of the second sub wirings is connected to one of the fourth sub wiring through more than two of the lateral wirings.

In some embodiments, a total cross-sectional area of the lateral wirings between any group of one first wiring of the first wirings and a corresponding one second wiring of the second wirings is one-half to two-thirds of a cross-section area of the one first wiring or the one second wiring connected to the lateral wirings.

Display panels and display devices are provided according to the present disclosure. The display panel includes a substrate, first wirings, second wirings, and lateral wirings. The substrate includes a first surface, a second surface oppositely arranged, and a lateral surface connecting the first surface and the second surface. The first wirings are arranged on the first surface of the substrate. The second wirings are arranged on the second surface of the substrate and corresponding to the first wirings. At least a part of the lateral wiring is arranged on the lateral surface. At least some of the lateral wirings connect the first wirings and the second wirings. Herein, a maximum line width of the lateral wirings is defined as a first line width, a maximum linear distance between two adjacent lateral wirings is defined as a first linear distance, a minimum line width of the first wirings is defined as a second line width, and a minimum linear distance of the first wirings is defined as a second linear distance. There is an alignment deviation between the first wiring and the second wiring. The first line width is less than a difference between the second linear distance and the alignment deviation, and the first linear distance is less than a difference between the second line width and the alignment deviation. In the present disclosure, the first line width is less than the difference between the second linear distance and the alignment deviation, and the first linear distance is less than the difference between the second line width and the alignment deviation, so that when the lateral wirings deviate, one lateral wiring will not connect two first wirings, one lateral wiring will not connect two second wirings, and one lateral wiring will not connect the first wiring and the second wiring that do not correspond, thus a short circuit between adjacent first wirings and a short circuit between adjacent second wirings can be avoided; and when the lateral wirings deviate, there is at least one lateral wiring for connecting the first wiring and the second wiring, so that first wiring and the second wiring can be connected normally, and the display panel can works normally, thereby improving a yield rate of the display panels.

BRIEF DESCRIPTION OF THE SEVERAL VIEWS OF THE DRAWINGS

FIGS. 1 (*a*), 1 (*b*) and 1 (*c*) are schematic views of an existing display device.

DESCRIPTION OF SPECIFIC EMBODIMENTS
OF THE INVENTION

The technical solutions in the embodiments of the present disclosure will be clearly and completely described below in conjunction with the drawings in the embodiments of the present disclosure. Apparently, the described embodiments are only some of the embodiments of the present disclosure, not all of them. Based on the embodiments in the present disclosure, all other embodiments obtained by those skilled in the art without making creative efforts belong to the scope of protection of the present disclosure.

Figure 1:
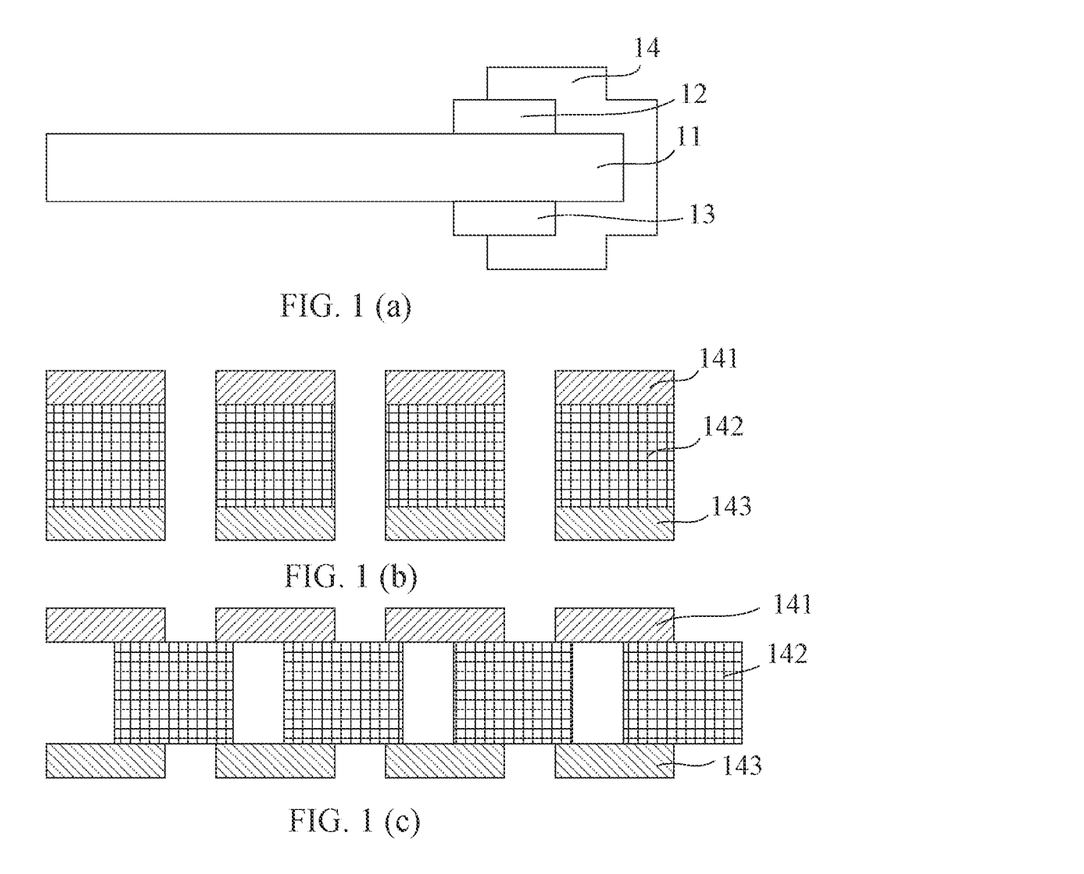

As illustrated in FIG. 1, a part (a) in FIG. 1 is a schematic cross-sectional view of an existing display device, a part (b) in FIG. 1 is a first schematic view of wires 14 in the existing display device, and a part (c) in FIG. 1 is a second schematic view of the wires 14 in the existing display device.

As illustrated in FIG. 1, the existing mini-LED/micro-LED display devices adopts the back-bonding technology to reduce a splicing width. Specifically, in the existing mini-LED/micro-LED display device, front terminals 12 are arranged on a front surface of a glass substrate 11 and connected to mini-LED/micro-LED light-emitting units, rear terminals 13 are arranged on a rear surface of the glass substrate 11 and connected to driver chips, and then the front terminals 12 and the rear terminals 13 are connected through the wires 14 to realize a display function of the mini-LED/micro-LED display device. Existing methods for preparing the wires 14 include laser etching, which needs to etch front wires 141, lateral wires 142, and rear wires 143 respectively. However, existing alignment terminals cannot be used for alignment when preparing metal wires on the lateral surface, so when the metal on the lateral surface of the glass substrate 11 is etched, the alignment accuracy will be insufficient, resulting in the problem of lateral deviation of the lateral wires. Specifically, as illustrated in the part (b) of FIG. 1, in an ideal condition, the lateral wire 142 is aligned with the front wire 141 and the rear wire 143, but due to misalignment during an etching process of the lateral wires 142, in actual conditions, as illustrated in the part (c) of FIG. 1, one lateral wire 142 may connect adjacent front wires 141 and adjacent rear wires 143, resulting in short circuits of the wires 14 and reducing the yield rate of the display device. Therefore, the existing display devices have the technical problem that the alignment accuracy of the lateral wires is insufficient, resulting in a short circuit between adjacent wires.

Embodiments of the present disclosure aim at the above-mentioned technical problem and provide a display panel and a display device to solve the above-mentioned technical problem.

Figure 2:
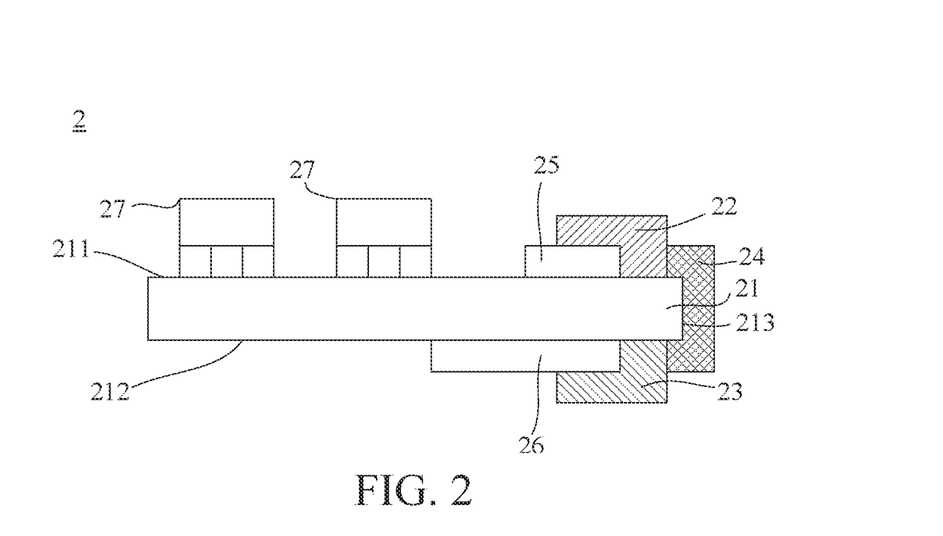
FIG. 2 is a first schematic view of a display device according to an embodiment of the present disclosure.
Figure 3:
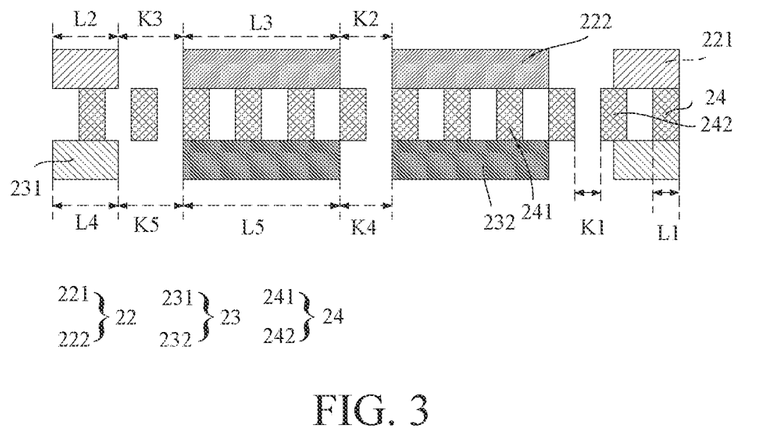
FIG. 3 is a second schematic view of a display device according to an embodiment of the present disclosure.
Figure 4:
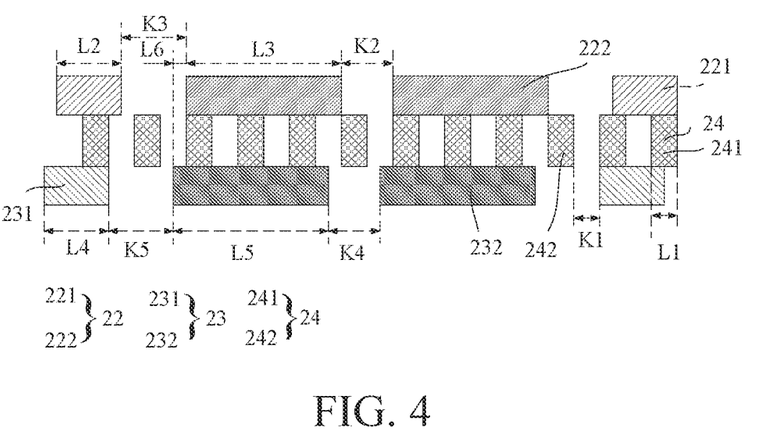
FIG. 4 is a third schematic view of a display device according to an embodiment of the present disclosure.

As illustrated in FIG. 2 to FIG. 4, embodiments of the present disclosure provide display panels, and the display panel 2 includes:

a substrate 21 including a first surface 211, a second surface 212 oppositely arranged, and a lateral surface 213 connecting the first surface 211 and the second surface 212;

first wirings 22 disposed on the first surface 211 of the substrate 21;

second wirings 23 disposed on the second surface 212 of the substrate 21 and arranged correspondingly to the first wirings 22; and lateral wirings 24, at least a part of each being disposed on the lateral surface 213, and at least some of the lateral wirings 24 connecting the first wirings 22 and the second wirings 23;

herein, a maximum line width of the lateral wirings 24 is defined as a first line width L1, a maximum linear distance between two adjacent ones of the lateral wirings 24 is defined as a first linear distance K1, a minimum line width of the first wirings 22 is defined as a second line width (for example, a line width L2 of a first sub wiring 221), a minimum linear distance of the first wirings 22 is defined as a second linear distance K2, and there is an alignment deviation L6 between the first wiring and the second wiring; the first line width L1 is less than a difference between the second linear distance K2 and the alignment deviation L6 (that is, L1<K2−L6), and the first linear distance K1 is less than a difference between the second line width and the alignment deviation L6 (that is, K1<L2−L6).

The display panels are provided according to the embodiments of the present disclosure. In the display panel, the first line width is less than the difference between the second linear distance and the alignment deviation, and the first linear distance is less than the difference between the second line width and the alignment deviation, so that when the lateral wirings deviate, one lateral wiring will not connect two first wirings, one lateral wiring will not connect two second wirings, and one lateral wiring will not connect the first wiring and the second wiring that do not correspond, thus a short circuit between adjacent first wirings and a short circuit between adjacent second wirings can be avoided; and when the lateral wirings deviate, there is at least one lateral wiring for connecting the first wiring and the second wiring, so that the first wiring and the second wiring can be connected normally, and the display panel can works normally, thereby improving a yield rate of the display panels.

It should be noted that the first surface 211 and the second surface 212 are two opposite surfaces. The first surface 211 and the second surface 212 may be respectively a front surface and a rear surface of the display panel, for example, the first surface 211 is a side surface for arranging the light-emitting units, and the second surface 212 is a side surface for bonding the driver chips.

It should be noted that a corresponding arrangement of the first wirings and the second wirings refers to that each of the first wirings corresponds to one of the second wirings when the lateral wirings connect the first wirings and the second wirings. The first wiring and the second wiring correspondingly arranged may have the same line width. A linear distance between two adjacent second wirings is equal to a linear distance between two first wirings correspondingly arranged. An offset distance between projections of the first wiring and the second wiring correspondingly arranged on the substrate is the alignment deviation between the first wiring and the second wiring. For example, in FIG. 3, each of the first wirings 22 corresponds to one of the second wirings 23; and in FIG. 4, the offset distance between the first wiring 22 and the second wiring 23 correspondingly arranged is the alignment deviation L6 between the first wiring 22 and the second wiring.

It should be noted that the maximum line width of the lateral wirings 24 refers to: when line widths of the lateral wirings 24 are not equal, a line width of the widest lateral wiring 24 is the maximum line width of the lateral wirings 24, that is, the line width of the widest lateral wiring 24 is the first line width; and when the line widths of the lateral wirings 24 are equal, the line width of any lateral wiring 24 is the maximum line width of the lateral wirings 24, that is, the line width of any lateral wiring 24 is the first line width. In the drawings according to the embodiments of the present disclosure, it is illustrated that the line widths of the lateral wirings 24 are the same, therefore, the line width of each of the lateral wirings 24 is the first line width L1.

It should be noted that the maximum linear distance between two adjacent lateral wirings 24 refers to: there is a distance between any two adjacent lateral wirings 24, and when the distance between two adjacent lateral wirings 24 is various, the maximum linear distance between two adjacent lateral wirings 24 is a distance between two adjacent lateral wirings 24 which are farthest apart from each other; and when the distance between two lateral wirings 24 is the same, the distance between any two adjacent lateral wirings 24 is the maximum linear distance between two adjacent lateral wirings 24. In the drawings according to the embodiments of the present disclosure, it is illustrated that the distance between any two adjacent lateral wirings 24 is the same, therefore, the distance between any two adjacent lateral wirings 24 is the first linear distance K1.

It should be noted that, as illustrated in FIG. 4, the first wirings 22 include first sub wirings 221 and second sub wirings 222. A line width L2 of the first sub wiring 221 is less than a line width L3 of the second sub wiring 222, so the minimum line width of the first wirings 22 is L2. It can be understood that FIG. 4 only illustrates two different line widths of the first wirings. When the display panel includes the first wirings with various line widths, the minimum line width of the first wirings is a line width of the narrowest first line.

It should be noted that, as illustrated in FIG. 4, a linear distance K2 between the second sub wiring 222 and the second sub wiring 222 is less than a linear distance K3 between the first sub wiring 221 and the second sub wiring, so the minimum linear distance of the first wirings 22 is K2. It can be understood that FIG. 4 only illustrates two different linear distances of the first wirings. When the first wirings of the display panel have various linear distances, the minimum linear distance of the first wirings is a distance between two adjacent first wirings which are nearest from each other. Similarly, a distance K4 between a fourth sub wiring 232 and another fourth sub wiring 232 is less than a distance K5 between the fourth sub wiring 232 and a third sub wiring 231, so the minimum linear distance of the second wirings is K4.

It should be noted that, that the distance between the second sub wiring and the second sub wiring is less than the distance between the first sub wiring and the second sub wiring is taken as an example for illustration in FIG. 4, but the embodiments of the present disclosure are not limited thereto. For example, the distance between the first sub wiring and the second sub wiring may be less than the distance between the second sub wiring and the second sub wiring, or the distance between the first sub wiring and the second sub wiring may be less than a distance between the first sub wiring and the first sub wiring line. Similarly, the arrangement of the third sub wirings and the fourth sub wirings can refer to that of the first sub wirings and the second sub wirings.

Specifically, FIG. 4 illustrates that the second sub wiring is adjacent to the second sub wiring, but the embodiments of the present disclosure are not limited thereto. For example, the second sub wiring may be adjacent to the first sub wiring, and the first sub wiring may be adjacent to the first sub wiring. Similarly, the arrangement of the third sub wirings and the fourth sub wirings can refer to that of the first sub wirings and the second sub wirings.

It should be noted that the alignment deviation between the first wiring and the second wiring refers to that, when the first wirings and the second wirings are prepared, due to the alignment accuracy, there is a certain deviation between the first wiring and the second wiring. For example, in FIG. 4, the second wiring 23 is shifted to the left relative to the first wiring 22, and specifically shifted by L6, so the alignment deviation between the first wiring and the second wiring is L6. And it can be understood that the alignment deviation between any two corresponding first and second wirings is L6.

It should be noted that, in the embodiments of the present disclosure, the wires connecting the first connection terminals 25 and the second connection terminals 26 are described with the first wirings, the second wirings, and the lateral wirings. But it can be understood that the first wirings, the second wirings, and the lateral wirings are three parts formed by etching a same film layer three times. These three parts may have no boundaries or some boundaries (in an area where a contact area between the first wiring and the lateral wiring is less than a cross-sectional area of the lateral wiring).

Specifically, as illustrated in FIG. 3 and FIG. 4, in the embodiment of the present disclosure, the first line width L1 is less than the difference between the second linear distance K2 and the alignment deviation L6, so that one lateral wiring can only be connected with at most one of adjacent first wirings 22, and will not be in contact with the non-corresponding second wiring 23, thereby avoiding the short circuit between the adjacent first wirings and he short circuit between the adjacent second wirings. The first linear distance K1 is less than the difference between the second line width and the alignment deviation L6, so that there must be at least one lateral wiring 24 between the first wiring and the second wiring 23 correspondingly arranged, and the first wiring 22 and the second wiring 23 are normally connected. The display panel can work normally, and the short circuit between the first wirings, the short circuit between the second wirings, and the short circuit between the first wiring and a non-corresponding second wiring are avoided, so as to improve the yield rate of the display panel.

In an embodiment, at least some of the lateral wirings have different line widths. For example, some lateral wirings have a line width greater than that of other lateral wirings.

In an embodiment, at least some of the lateral wirings have different linear distances therebetween. For example, the linear distance between two adjacent ones of some lateral wirings is the first linear distance, and the linear distance between two adjacent ones of other lateral wirings is less than the first linear distance.

In view of a problem that unequal line widths of the lateral wirings will result in a small number of the lateral wirings and a large total impedance of the lateral wirings connecting the first wirings and the second wirings, in an embodiment, as illustrated in FIG. 3, the line widths of any two lateral wirings 24 are equal. That is, the line width of each lateral wiring 24 is the first line width L1. By making the line widths of the lateral wirings equal, more lateral wirings can be arranged in a same space, and a total cross-sectional area of the lateral wirings between any group of the first wiring and the second wiring correspondingly arranged approaches a cross-section area of the first wiring or the second wiring connected thereto, so that problems such as excessive voltage drop and blown wiring during signal transmission can be avoided, and the yield rate of the display panel can be improved.

In view of a problem that unequal linear distances of the lateral wirings will result in a small number of the lateral wirings and a large total impedance of the lateral wirings connecting the first wirings and the second wirings, in an embodiment, as illustrated in FIG. 3, the linear distance between any two adjacent lateral wirings 24 is the same. That is, the linear distance between any two adjacent lateral wirings 24 is the first linear distance K1. By making the linear distance between any two adjacent lateral wirings the same, more lateral wirings can be arranged in a same space, and a total cross-sectional area of the lateral wirings between any group of the first wiring and the second wiring correspondingly arranged approaches a cross-section area of the first wiring or the second wiring connected thereto, so that the problems such as excessive voltage drop and blown wiring during signal transmission can be avoided, and the yield rate of the display panel can be improved.

The foregoing embodiments are respectively described by taking the example that the line widths of any two lateral wirings are equal or the linear distance between any two adjacent lateral wirings is the same. However, the embodiments of the present disclosure are not limited thereto. For example, the line widths of any two lateral wirings may be equal and at the same time the linear distance between any two adjacent lateral wirings may be the same, so that the most lateral wirings can be arranged in the same space, and a total cross-sectional area of the lateral wirings between any group of the first wiring and the second wiring correspondingly arranged approaches a cross-section area of the first wiring or the second wiring connected thereto, so that the problems such as excessive voltage drop and blown wiring during signal transmission can be avoided, and the yield rate of the display panel can be improved.

That the alignment deviation between the first wiring and the second wiring is greater than the line width of the first wiring may cause a problem that the first wiring and the second wiring cannot be connected. In view of the problem, in an embodiment, the minimum line width of the first wirings is greater than the alignment deviation between the first wiring and the second wiring. By making the minimum line width of the first wirings greater than the alignment deviation between the first wiring and the second wiring, that the first wiring and the second wiring correspondingly arranged are completely misaligned is avoided, so that the first wiring and the second wiring correspondingly arranged can be connected to improve the yield rate of the display panel.

That the alignment deviation between the first wiring and the second wiring is greater than the line width of the lateral wiring may cause a problem that the first wiring and the second wiring cannot be connected. In view of the problem, in an embodiment, as illustrated in FIG. 4, the line width of the lateral wiring 24 is greater than the alignment deviation L6 between the first wiring 22 and the second wiring 23. By making the line width of the lateral wiring greater than the alignment deviation between the first wiring and the second wiring, the lateral wiring can be connected to the first wiring and the second wiring. In this way, that the signal cannot be transmitted because the first wiring and the second wiring are not connected can be avoided, which improves the yield rate of the display panel.

In an embodiment, the line width of the lateral wiring may also be less than or equal to the alignment deviation between the first wiring and the second wiring.

In an embodiment, as illustrated in FIG. 2 and FIG. 3, the alignment deviation between the first wiring 22 and the second wiring 23 is 0, and the projection of the first wiring 22 on the substrate 21 coincides with the projection of the second wiring 23 on the substrate 21. By making the alignment deviation between the first wiring and the second wiring 0, and making the projection of the first wiring on the substrate coincide with the projection of the second wiring on the substrate, when preparing the lateral wirings, the line width and/or the linear distance of the lateral wirings can be set wider, so as to avoid problems of open circuit or excessive impedance caused by too narrow line width of the lateral wiring, and avoid short circuit caused by too narrow linear distance of lateral wirings.

Specifically, for example, if the alignment deviation between the first wiring and the second wiring is 1 micron, and the minimum linear distance of the first wirings is 6 microns, then the line width of the lateral wiring needs to be less than 5 microns; while the alignment deviation between the first wiring and the second wiring is 0, and the minimum linear distance of the first wiring is 6 microns, then the line width of the lateral wiring only needs to be less than 6 microns. Thus, the line width of the lateral wiring can be increased, and the linear distance of the lateral wirings can be similarly increased.

In an embodiment, the alignment deviation between the first wiring and the second wiring is less than or equal to 5 microns. Specifically, when using a laser machine for alignment, there will be a certain alignment accuracy deviation, which will lead to the alignment deviation between the first wiring and the second wiring. By making the alignment deviation between the first wiring and the second wiring less than or equal to 5 microns, an excessive alignment deviation which may cause the lateral wiring to fail to connect the first wiring and the second wiring correspondingly arranged can be avoided, thereby improving the yield rate of the display panel.

In an embodiment, as illustrated in FIG. 3, some of the lateral wirings 24 are insulated from the first wirings 22, and the lateral wirings 24 insulated from the first wirings 22 are also insulated from the second wirings 23. By insulating some of the lateral wirings from the first wirings and from the second wirings, the lateral wirings are prevented from conducting adjacent first wirings and from conducting adjacent second wirings, and the yield rate of the display panel is improved.

Specifically, as illustrated in FIG. 3, compared with the existing display devices, in which the lateral wire located between two adjacent front wires will conduct the adjacent front wires and the adjacent rear wires, resulting in a problem of short circuit in the display device and low yield rate of the device, in the embodiments of the present disclosure, the first line width is less than the difference between the second line linear distance and the alignment deviation, and the first line linear distance is less than the difference between the second line width and the alignment deviation, so that when the lateral wirings deviate, the lateral wiring located between two adjacent first wirings will be suspended and will not be connected with any first wiring and any second wiring, so that the lateral wiring can be prevented from conducting adjacent first wirings and/or adjacent second wirings, thereby improving the yield rate of the display panel.

In an embodiment, as illustrated in FIG. 3 and FIG. 4, the lateral wirings 24 include first lateral wirings 241. A contact area between the first lateral wiring 241 and the first wiring 22 is equal to a cross-sectional area of the first lateral wiring 241, and a contact area between the first lateral wiring 241 and the second wiring 23 is less than or equal to the cross-sectional area of the first lateral wiring 241. By making one end of the first lateral wiring completely in contact with the first wiring, and the other end of the first lateral wiring completely in contact with the second wiring, a connection effect between the first wiring and the second wiring is better, thereby avoiding poor connection between the first wiring and the second wiring which leads to poor signal transmission effect, and thus improving the yield rate of the display panel. By making one end of the first lateral wiring completely in contact with the first wiring, and the other end of the first lateral wiring partially in contact with the second wiring, the lateral wiring can connect the first wiring and the second wiring, thus the display panel can normally work.

Specifically, since the embodiments of the present disclosure do not specifically limit the first wirings and the second wirings, it may be that the first wirings are connected to the terminals on a display side and the second wirings are connected to the terminals on a side on which the driver chips are bounded. Alternatively, it may also be that the second wirings are connected to the terminals on the display side, and the first wirings are connected to the terminals on the side on which the driver chips are bounded. It can be understood that, the contact area between the first lateral wiring 241 and the second wiring 23 may be equal to the cross-sectional area of the first lateral wiring 241, and the contact area between the first lateral wiring 241 and the first wiring 22 may be less than or equal to the cross-sectional area of the first lateral wiring 241.

Specifically, as illustrated in FIG. 3, it can be seen that the two ends of the first lateral wiring 241 are in full contact with the first wiring 22 and the second wiring 23 respectively. As illustrated in FIG. 4, one end of the first lateral wiring 241 is in full contact with the first wiring 22, and the other end of the first lateral wiring 241 is in partial contact with the second wiring 23.

Specifically, when the alignment deviation between the first wiring and the second wiring is 0, some of the lateral wirings may each have a cross-sectional area equal to the contact area between the lateral wiring and the first wiring, and equal to the contact area between the lateral wiring and the second wiring. When the alignment deviation between the first wiring and the second wiring is greater than 0, some of the lateral wirings may each have a cross-sectional area equal to the contact area between the lateral wiring and the first wiring, and equal to the contact area between the lateral wiring and the second wiring; and some of the lateral wirings may also each have a cross-sectional area equal to the contact area between the lateral wiring and the first wiring, and greater than the contact area between the lateral wiring and the second wiring.

In an embodiment, as illustrated in FIG. 3 and FIG. 4, the lateral wirings 24 include second lateral wirings 242. A contact area between the second lateral wiring 242 and the first wiring 22 is less than a cross-sectional area of the second lateral wiring 242, and a contact area between the second lateral wiring 242 and the second wiring 23 is less than the cross-sectional area of the second lateral wiring 242. By making one end of the second lateral wiring partially in contact with the first wiring, and the other end of the second lateral wiring partially in contact with the second wiring, the second lateral wiring is misaligned with the first wiring and the lateral wiring can be normally connected to the first wiring. At the same time, since the maximum line width of the lateral wirings is less than the difference between the minimum linear distance of the first wirings and the alignment deviation between the first wiring and the second wiring, that the lateral wiring connects the adjacent first wirings is avoided, thereby avoiding a short circuit between the wirings in the display panel, and improving the yield rate of the display panel.

Specifically, when the cross-sectional area of the lateral wiring is greater than the contact area between the lateral wiring and the first wiring, the contact area between the lateral wiring and the first wiring may be equal to the contact area between the lateral wiring and the second wiring or may be greater than the contact area between the lateral wiring and the second wiring. For example, the lateral wiring is in contact with the first wiring, but the lateral wiring is insulated from the second wiring.

In an embodiment, as illustrated in FIG. 4, the first wirings 22 include first sub wirings 221 and second sub wirings 222, the second wirings 23 include third sub wirings 231 and fourth sub wirings 232, the third sub wirings 231 are arranged corresponding to the first sub wirings 221, and the fourth sub wirings 232 are arranged corresponding to the second sub wirings 222. A line width L2 of the first sub wiring 221 is equal to a line width L4 of the third sub wiring 231, and a line width L3 of the second sub wiring 222 is equal to a line width L5 of the fourth sub wiring 232. The line width L3 of the second sub wiring 222 is greater than the line width L2 of the first sub wiring 221. A number of the lateral wirings 24 for connecting the first sub wirings 221 and the third sub wirings 231 is less than or equal to a number of the lateral wirings 24 for connecting the second sub wirings 222 and the fourth sub wirings 232. By making the first wirings include the first sub wirings and the second sub wirings with different widths, correspondingly making the second wirings include the third sub wirings and the fourth sub wirings with different widths, when the first sub wiring and the third sub wiring are correspondingly connected by the lateral wirings, and when the second sub wiring and the fourth sub wiring are correspondingly connected by the lateral wirings, the second sub wiring and the fourth sub wiring with a larger width can be connected through more lateral wirings, so as to avoid a problem of fusing of the first wiring and the second wiring caused by an excessive current of the second sub wiring and the fourth sub wiring, thereby improving the yield rate of the display panel.

Specifically, when arranging the first wirings and the second wirings, since signals input by different signal lines in the display panel are different, for example, a voltage input by some signal lines is relatively high, and a voltage input by some signal lines is relatively low, then it is necessary to adjust the line widths and linear distances of the signal lines, which will make the widths and linear distances of the connection terminals connected to the signal lines different, and finally make the line widths and linear distances of at least some of the first wirings different, and make the line widths and linear distances of at least some of the second wirings different.

In view of the different line widths of the first wirings, the embodiments of the present disclosure make the line widths of the lateral wirings equal, and make the linear distances between every two adjacent lateral wirings are the same, so that when the lateral wirings are connected to the first wirings and the second wirings with different widths, a total cross-sectional area of the lateral wirings between any group of the first wiring and the second wiring correspondingly arranged approaches a cross-section area of the first wiring or the second wiring connected thereto, so that the problems such as excessive voltage drop and blown wiring during signal transmission can be avoided, and the yield rate of the display panel can be improved.

Specifically, the total cross-sectional area of the lateral wirings refers to a sum of the cross-sectional areas of the lateral wirings.

Specifically, as illustrated in FIG. 4, a number of the lateral wirings 24 connecting the first sub wiring 221 and the third sub wiring 231 may be one or two, and a number of the lateral wirings 24 connecting the second sub wiring 222 and the fourth sub wiring 231 is three, so that when the widths of the second sub wiring and fourth sub wiring is large, a total width of the lateral wirings connecting the second sub wiring and the fourth sub wiring can also be larger, that is, the total cross-sectional area of the lateral wirings connecting the second sub wiring and the fourth sub wiring is larger, so as to avoid problems such as excessive voltage drop and wire fusing during signal transmission, reduce loss of the signal transmission, reduce a power consumption of the display panel, and improve the yield rate of the display panel.

Specifically, when the total cross-sectional area of the lateral wirings between any group of the first wiring and the second wiring correspondingly arranged approaches the cross-section area of the first wiring or the second wiring connected thereto, the total cross-sectional area of the lateral wirings between any group of the first wiring and the second wiring correspondingly arranged may be one-half to two-thirds of the cross-section area of the first wiring or the second wiring connected thereto.

Specifically, a cross-sectional area of the lateral wiring connecting the first wiring and the second wiring can be increased by increasing the line width. For example, by making the line width of the lateral wiring one-fourth to one-half of the line width of the first wiring, the cross-sectional area of the lateral wiring connecting the first wiring and the corresponding second wiring can be increased, and the impedance of the lateral wiring and the risk of disconnection of the lateral wiring can be reduced.

Specifically, by reducing the linear distance between adjacent lateral wirings, for example, making the linear distance of the lateral wirings one-half to one-tenth of the minimum linear distance of the first wirings, an arrangement density of the lateral wirings becomes larger, and the impedance of the lateral wirings connecting the first wiring and the second wiring correspondingly arranged is reduced, and the risk of disconnection of the lateral wiring is reduced.

Specifically, it is also possible to reduce the line widths and linear distance of the lateral wirings at the same time. By making the line widths and linear distance of the lateral wiring as narrow as possible, the arrangement density of the lateral wirings is relatively large, and the total cross-sectional area of the lateral wirings between any group of the first wiring and the second wiring correspondingly arranged can more approach the cross-sectional area of the first wiring or the second wiring connected thereto, so that the total impedance of the lateral wirings is lower and the risk of disconnection of the lateral wirings is reduced, which improves the yield rate of the display panel.

Specifically, that the number of the lateral wirings connecting the first sub wiring and the third sub wiring is less than the number of the lateral wirings connecting the second sub wiring and the fourth sub wiring is taken as an example for illustration in FIG. 4, but the embodiments of the present disclosure are not limited thereto. For example, the number of the lateral wirings connecting the first sub wiring and the third sub wiring may be equal to the number of the lateral wirings connecting the second sub wiring and the fourth sub wiring.

Figure 5:
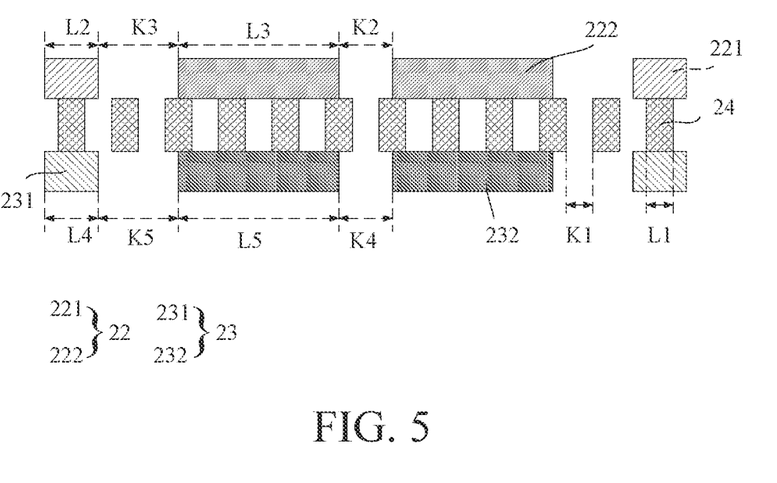
FIG. 5 is a fourth schematic view of a display device according to an embodiment of the present disclosure.

In an embodiment, as illustrated in FIG. 5, the line width L2 of the first sub wiring 221 is less than a sum of the line width of the corresponding lateral wiring 24 and the linear distance of the lateral wirings 24, and the first sub wiring 221 is connected to the third sub wiring 231 through one lateral wiring 24. Taking the line width of the lateral wiring 24 as the first line width L1 and the linear distance of the lateral wirings 24 as the first linear distance K1 as an example, that is, L2 is less than L1+K1. By making the line width of the first sub wiring less than the sum of the line width of the corresponding lateral wiring and the linear distance of the lateral wirings, only one lateral wiring can be connected to the first sub wiring and the third sub wiring, thereby preventing the lateral wiring from connecting the adjacent first sub wirings to avoid the problem of short circuit between adjacent wirings.

Specifically, the above embodiment is described in detail by taking the line width of the first sub wiring less than the sum of the line width of the corresponding lateral wiring and the linear distance of the lateral wirings as an example, but the embodiments of the present disclosure are not limited thereto. For example, the line width of the first sub wiring may also be greater than or equal to the sum of the line width of the corresponding lateral wiring and the linear distance of the lateral wirings.

In an embodiment, as illustrated in FIG. 5, the line width L3 of the second sub wiring 222 is greater than a sum of twice the line width L1 of the lateral wiring 24 and the linear distance K1 of the lateral wirings 24, and the second sub wiring 222 is connected to the fourth sub wiring 232 through more than two lateral wirings 24. By making the line width of the second sub wiring greater than the sum of twice the line width of the lateral wiring and the linear distance of the lateral wirings, the second sub wiring and the fourth sub wiring can be connected through more than two lateral wirings. When the second sub wiring and the fourth sub wiring transmit signals through the lateral wiring, problems of high power consumption due to excessive voltage drop of the lateral wirings and fusing of the lateral wirings due to excessive current can be avoided, thereby reducing the power consumption of the display panel and improving the yield rate of the display panel.

Specifically, the above embodiment is described in detail by taking the line width of the second sub wiring greater than the sum of twice the line width of the lateral wiring and the linear distance of the lateral wirings as an example, but the embodiments of the present disclosure are not limited thereto. For example, the line width of the second sub wiring may also be greater than a sum of the line width of the lateral wiring and the linear distance of the lateral wirings and be less than twice the line width of the lateral wiring and the linear distance of the lateral wirings.

In an embodiment, as illustrated in FIG. 4, some of the first sub wirings 221 and the third sub wirings 231 are connected through one lateral wiring 24, and some of the first sub wirings 221 and the third sub wirings 231 are connected through multiple lateral wirings 24.

In an embodiment, some of the second sub wirings and the fourth sub wirings are connected through one lateral wiring, and some of the second sub wirings and the fourth sub wirings are connected through multiple lateral wirings.

In an embodiment, the line width of the first wiring is equal to the line width of the corresponding second wiring, and the linear distance between two adjacent first wirings is the same as the linear distance between the corresponding two second wirings. By making the line width of the first wiring same with the line width of the corresponding second wiring, and making the linear distance between two adjacent first wirings same with the linear distance between two adjacent second wirings, when the first wirings and the second wirings are arranged, the first wirings and the second wirings can be arranged correspondingly to transmit each signal, and when the lateral wirings are arranged, the lateral wirings can be arranged according to the line width and the linear distance of the first wirings or the second wirings, so as to avoid the inconsistency of the first wirings and the second wirings at the line width and/or the linear distance, which will cause the lateral wiring to short-circuit the first wirings and the second wirings, thereby improving the yield rate of display panel.

In view of that the back-bonding technology of the existing glass-based mini-LED/micro-LED display devices are applied in the display devices having a dot pitch greater than 1 micron, in an embodiment, the line width of the lateral wiring ranges from 4 microns to 50 microns, and the linear distance of the lateral wirings ranges from 4 microns to 50 microns.

In an embodiment, the line width of the first wirings ranges from 5 microns to 500 microns, and the linear distance of the first wirings ranges from 5 microns to 51 microns.

In an embodiment, a material of the substrate includes glass. By making the material of the substrate include glass, a same mark alignment can be used when the first wirings and the second wirings are prepared, so that the first wirings and the second wirings can be aligned within alignment tolerances.

In an embodiment, as illustrated in FIG. 2, the display panel further includes light-emitting units 27, and the light-emitting unit 27 include a mini-LED light-emitting unit or a micro-LED light-emitting unit.

In an embodiment, as illustrated in FIG. 2, the display panel further includes first connection terminals 25 and second connection terminals 26. The first connection terminal 25 is connected to the first wiring 22, and the second connection terminal 26 is connected to the second wiring 23.

In an embodiment, the first connection terminals are connected to the first wirings in one-to-one correspondence. A width of the first connection terminal is equal to the line width of the corresponding first wiring, and a distance between adjacent first connection terminals is equal to the linear distance between two corresponding first wirings.

In an embodiment, the second connection terminals are connected to the second wirings in one-to-one correspondence. A width of the second connection terminal is equal to the line width of the corresponding second wiring, and a distance between adjacent second connection terminals is equal to the linear distance between two corresponding second wirings.

In an embodiment, materials of the first wiring, the second wiring and the lateral wiring include metal.

In the above-mentioned embodiments, the alignment deviation between the first wiring and the second wiring, contact modes between the lateral wiring and the first wiring or the second wiring, and connections of the first sub wiring, the second sub wiring, the third sub wiring, the fourth sub wiring, and the lateral wiring have been described in detail, but the embodiments of the present disclosure are not limited thereto. When the various embodiments do not conflict, various embodiments can be combined. For example, When the alignment deviation between the first wiring and the second wiring is 0, some of the lateral wirings can be insulated from the first wirings, and the lateral wirings insulated from the first wirings can be insulated from the second wirings. For example, the line width of the first wiring ranges from 5 microns to 500 microns, the linear distance of the first wirings ranges from 5 to 51 microns, the line width of the first wiring is equal to the line width of the corresponding second wiring, and the linear distance between two adjacent first wirings is equal to the 1 linear distance between the corresponding two second wirings.

Figure 6:
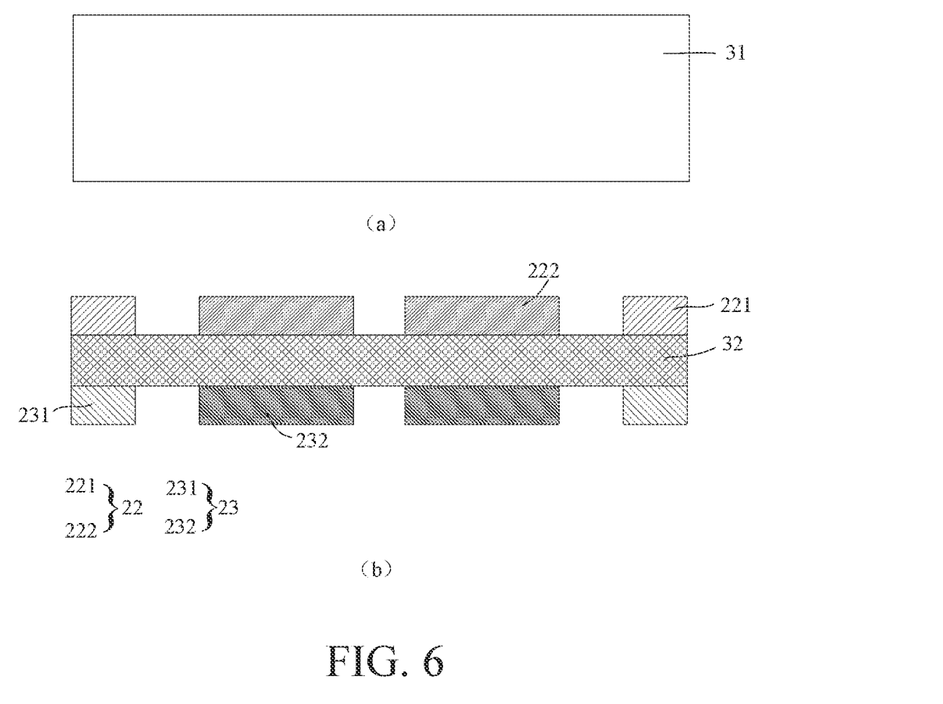
FIG. 6 is a schematic structural view of a display panel corresponding to each step of a method for manufacturing the display panel according to an embodiment of the present disclosure.

Specifically, FIG. 6 is a schematic structural view of a display panel corresponding to each step of a method for manufacturing the display panel according to an embodiment of the present disclosure.

At the same time, the embodiments of the present disclosure provide a manufacturing method of a display panel, and the manufacturing method of the display panel is configured to prepare the display panel as described in any one of the above-mentioned embodiments. The manufacturing method of the display panel includes following steps.

A substrate is provided.

A metal layer on a first surface, a second surface, and a lateral surface of the substrate is formed through one of printing, physical vapor deposition, electroplating, and chemical coating on the substrate, as a structure of the display panel illustrated in (a) of FIG. 6;

Specifically, the metal layer 31 may be formed by coating the first surface, the second surface, and the lateral surface of the substrate.

A part of the metal layer on the first surface and a part of the metal layer on the second surface are etched to form first wirings and second wirings, respectively, as a structure of the display panel illustrated in (b) of FIG. 6.

Specifically, a same alignment mark can be used to perform laser etching on the part of the metal layer on the first surface and the part of the metal layer on the second surface, so that the first wirings and the second wirings are arranged correspondingly, while the unetched part 32 between the first wirings and the second wirings is retained.

A laser etching is performed on an unetched part of the metal layer to form lateral wirings as a structure of the display panel illustrated in FIG. 3.

Specifically, after the first wirings, the second wirings, and the lateral wirings are formed, the first wirings, the second wirings, and the lateral wirings can also be packaged with an encapsulation material, so as to prevent the first wirings, the second wirings, and the lateral wirings from water oxygen, and mechanical impact damage.

Meanwhile, embodiments of the present disclosure provide a display device, which includes the display panel and the driving chips as described in any one of the above embodiments.

Figure 7:
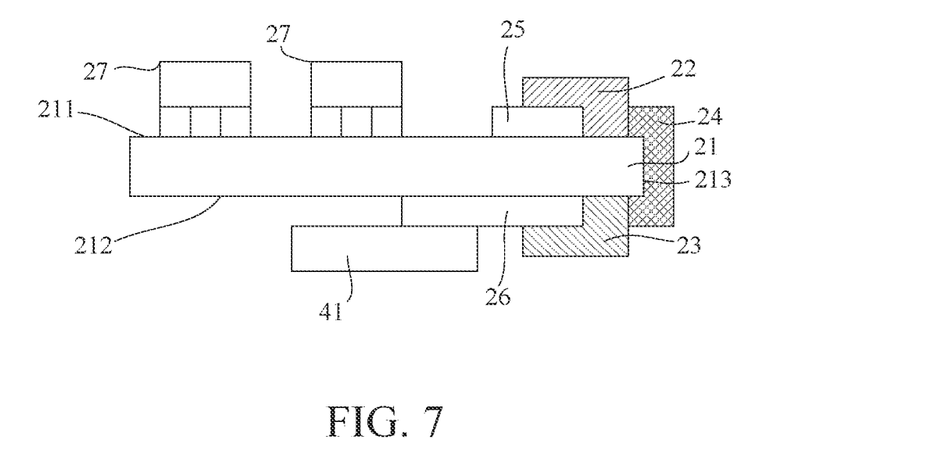
FIG. 7 is a schematic view of a display device according to an embodiment of the present disclosure.

Specifically, as illustrated in FIG. 7, the driving chip 41 is connected to the second connection terminal 26.

According to above-mentioned embodiments, it can be known:

The display panels and the display devices are provided according to embodiments of the present disclosure. The display panel includes a substrate, first wirings, second wirings, and lateral wirings. The substrate includes a first surface, a second surface oppositely arranged, and a lateral surface connecting the first surface and the second surface.

The first wirings are arranged on the first surface of the substrate. The second wirings are arranged on the second surface of the substrate and corresponding to the first wirings. At least a part of the lateral wiring is arranged on the lateral surface. At least some of the lateral wirings connect the first wirings and the second wirings. Herein, a maximum line width of the lateral wirings is defined as a first line width, a maximum linear distance between two adjacent lateral wirings is defined as a first linear distance, a minimum line width of the first wirings is defined as a second line width, and a minimum linear distance of the first wirings is defined as a second linear distance. There is an alignment deviation between the first wiring and the second wiring. The first line width is less than a difference between the second linear distance and the alignment deviation, and the first linear distance is less than a difference between the second line width and the alignment deviation. In the present disclosure, the first line width is less than the difference between the second linear distance and the alignment deviation, and the first linear distance is less than the difference between the second line width and the alignment deviation, so that when the lateral wirings deviate, one lateral wiring will not connect two first wirings, one lateral wiring will not connect two second wirings, and one lateral wiring will not connect the first wiring and the second wiring that do not correspond, thus a short circuit between adjacent first wirings and a short circuit between adjacent second wirings can be avoided; and when the lateral wirings deviate, there is at least one lateral wiring for connecting the first wiring and the second wiring, so that first wiring and the second wiring can be connected normally, and the display panel can works normally, thereby improving a yield rate of the display panels.

In the foregoing embodiments, the descriptions of each embodiment have their own emphases, and for parts not described in detail in a certain embodiment, reference may be made to relevant descriptions of other embodiments.

The above is a detailed introduction to the display panels and the display device provided according to the embodiments of the present disclosure. In this paper, specific examples are used to illustrate the principles and implementation methods of the present disclosure. The descriptions of the above embodiments are only used to help understand technical solutions of the present disclosure and their core ideas. Those of ordinary skill in the art should understand that: it is still possible to modify the technical solutions recorded in the foregoing embodiments, or perform equivalent replacements for some of the technical features, but these modifications or replacements do not make the essence of the corresponding technical solutions depart from the scope of the technical solutions of the embodiments of the present disclosure.

What is claimed is:

1. A display panel, comprising:
   a substrate including a first surface, a second surface oppositely arranged, and a lateral surface connecting the first surface and the second surface;
   first wirings arranged on the first surface of the substrate;
   second wirings arranged on the second surface of the substrate and corresponding to the first wirings;
   lateral wirings, wherein a part of each of the lateral wirings is arranged on the lateral surface, and some of the lateral wirings connect the first wirings and the second wirings;
   wherein a maximum line width of the lateral wirings is defined as a first line width, a maximum linear distance between two adjacent ones of the lateral wirings is defined as a first linear distance, a minimum line width of the first wirings is defined as a second line width, a minimum linear distance of the first wirings is defined as a second linear distance, and there is an alignment deviation between the first wirings and the second wirings; and
   wherein the first line width is less than a difference between the second linear distance and the alignment deviation, and the first linear distance is less than a difference between the second line width and the alignment deviation.

2. The display panel according to claim 1, wherein line widths of any two ones of the lateral wirings are equal, and a linear distance between any two adjacent ones of the lateral wirings is same.

3. The display panel according to claim 1, wherein the alignment deviation between the first wirings and the second wirings is 0, and a projection of the first wirings on the substrate coincides with a projection of the second wirings on the substrate.

4. The display panel according to claim 1, wherein some of the lateral wirings are insulated from the first wirings, and the lateral wirings insulated from the first wirings are insulated from the second wirings.

5. The display panel according to claim 1, wherein the lateral wirings comprise first lateral wirings, a contact area between the first lateral wirings and the first wirings is equal to cross-sectional areas of the first lateral wirings, and a contact area between the first lateral wirings and the second wirings is less than or equal to the cross-sectional areas of the first lateral wirings.

6. The display panel according to claim 1, wherein the lateral wirings comprise second lateral wirings, a contact area between the second lateral wirings and the first wirings is less than cross-sectional areas of the second lateral wirings, and a contact area between the second lateral wirings and the second wirings is less than the cross-sectional areas of the second lateral wirings.

7. The display panel according to claim 1, wherein the first wirings comprise first sub wirings and second sub wirings;
   the second wirings comprise third sub wirings arranged corresponding to the first sub wirings and fourth sub wirings arranged corresponding to the second sub wirings; and
   a line width of each of the first sub wirings is equal to a line width of each of the third sub wirings, a line width of each of the second sub wirings is equal to a line width of each of the fourth sub wirings, the line width of each of the second sub wirings is greater than the line width of each of the first sub wirings, a number of the lateral wirings for connecting the first sub wirings and the third sub wirings is less than or equal to a number of the lateral wirings for connecting the second sub wirings and the fourth sub wirings.

8. The display panel according to claim 7, wherein the line width of each of the first sub wirings is less than a sum of a line width of a corresponding one of the lateral wirings and a linear distance of the lateral wirings corresponding arranged, and each of the first sub wirings is connected to one of the third sub wirings through one of the lateral wirings.

9. The display panel according to claim 7, wherein the line width of each of the second sub wirings is greater than a sum of twice line width of a corresponding one of the lateral wirings and a linear distance of the lateral wirings corresponding arranged, and each of the second sub wirings is connected to one of the fourth sub wiring through more than two of the lateral wirings.

10. The display panel according to claim 1, wherein a total cross-sectional area of the lateral wirings between any group of one first wiring of the first wirings and a corresponding one second wiring of the second wirings is one-half to two-thirds of a cross-section area of the one first wiring or the one second wiring connected to the lateral wirings.

11. A display device, comprising a display panel and driver chips, and the display panel comprising:
a substrate including a first surface, a second surface oppositely arranged, and a lateral surface connecting the first surface and the second surface;
first wirings arranged on the first surface of the substrate;
second wirings arranged on the second surface of the substrate and corresponding to the first wirings;
lateral wirings, wherein a part of each of the lateral wirings is arranged on the lateral surface, and some of the lateral wirings connect the first wirings and the second wirings;
wherein a maximum line width of the lateral wirings is defined as a first line width, a maximum linear distance between two adjacent ones of the lateral wirings is defined as a first linear distance, a minimum line width of the first wirings is defined as a second line width, a minimum linear distance of the first wirings is defined as a second linear distance, and there is an alignment deviation between the first wirings and the second wirings; and
wherein the first line width is less than a difference between the second linear distance and the alignment deviation, and the first linear distance is less than a difference between the second line width and the alignment deviation.

12. The display device according to claim 11, wherein line widths of any two ones of the lateral wirings are equal, and a linear distance between any two adjacent ones of the lateral wirings is same.

13. The display device according to claim 11, wherein the alignment deviation between the first wirings and the second wirings is 0, and a projection of the first wirings on the substrate coincides with a projection of the second wirings on the substrate.

14. The display device according to claim 11, wherein some of the lateral wirings are insulated from the first wirings, and the lateral wirings insulated from the first wirings are insulated from the second wirings.

15. The display device according to claim 11, wherein the lateral wirings comprise first lateral wirings, a contact area between the first lateral wirings and the first wirings is equal to cross-sectional areas of the first lateral wirings, and a contact area between the first lateral wirings and the second wirings is less than or equal to the cross-sectional areas of the first lateral wirings.

16. The display device according to claim 11, wherein the lateral wirings comprise second lateral wirings, a contact area between the second lateral wirings and the first wirings is less than cross-sectional areas of the second lateral wirings, and a contact area between the second lateral wirings and the second wirings is less than the cross-sectional areas of the second lateral wirings.

17. The display device according to claim 11, wherein the first wirings comprise first sub wirings and second sub wirings;
the second wirings comprise third sub wirings arranged corresponding to the first sub wirings and fourth sub wirings arranged corresponding to the second sub wirings; and
a line width of each of the first sub wirings is equal to a line width of each of the third sub wirings, a line width of each of the second sub wirings is equal to a line width of each of the fourth sub wirings, the line width of each of the second sub wirings is greater than the line width of each of the first sub wirings, a number of the lateral wirings for connecting the first sub wirings and the third sub wirings is less than or equal to a number of the lateral wirings for connecting the second sub wirings and the fourth sub wirings.

18. The display device according to claim 17, wherein the line width of each of the first sub wirings is less than a sum of a line width of a corresponding one of the lateral wirings and a linear distance of the lateral wirings corresponding arranged, and each of the first sub wirings is connected to one of the third sub wirings through one of the lateral wirings.

19. The display device according to claim 17, wherein the line width of each of the second sub wirings is greater than a sum of twice line width of a corresponding one of the lateral wirings and a linear distance of the lateral wirings corresponding arranged, and each of the second sub wirings is connected to one of the fourth sub wiring through more than two of the lateral wirings.

20. The display device according to claim 11, wherein a total cross-sectional area of the lateral wirings between any group of one first wiring of the first wirings and a corresponding one second wiring of the second wirings is one-half to two-thirds of a cross-section area of the one first wiring or the one second wiring connected to the lateral wirings.

* * * * *